United States Patent
Suzuki et al.

[11] Patent Number: 6,011,305
[45] Date of Patent: Jan. 4, 2000

[54] SEMICONDUCTOR DEVICE HAVING METAL ALLOY FOR ELECTRODES

[75] Inventors: Kouichi Suzuki; Sadanobu Sato; Yumiko Yamashita, all of Tokyo, Japan

[73] Assignee: NEC Corporation, Tokyo, Japan

[21] Appl. No.: 09/027,953

[22] Filed: Feb. 23, 1998

[30] Foreign Application Priority Data

Feb. 21, 1997 [JP] Japan ................................ 9-037338

[51] Int. Cl.⁷ .................................................. H01L 23/49
[52] U.S. Cl. ........................... 257/738; 257/741; 257/768
[58] Field of Search ............................... 257/738, 737, 257/764–784, 741

[56] References Cited

U.S. PATENT DOCUMENTS

| | | | |
|---|---|---|---|
| 4,845,543 | 7/1989 | Okikawa et al. | 257/784 |
| 5,172,212 | 12/1992 | Baba | 257/738 |
| 5,455,195 | 10/1995 | Ramsey et al. | 257/737 |
| 5,635,763 | 6/1997 | Inoue et al. | 257/764 |

FOREIGN PATENT DOCUMENTS

| | | |
|---|---|---|
| 56-49535 | 5/1981 | Japan . |
| 60-38846 | 2/1985 | Japan . |
| 2-110958 | 4/1990 | Japan . |
| 2-119148 | 5/1990 | Japan . |
| 2-237053 | 9/1990 | Japan . |
| 3-232258 | 10/1991 | Japan . |
| 4-179246 | 6/1992 | Japan . |
| 4-229631 | 8/1992 | Japan . |
| 6-112251 | 4/1994 | Japan . |
| 6-326220 | 11/1994 | Japan . |
| 7-335684 | 12/1995 | Japan . |

*Primary Examiner*—David B. Hardy
*Attorney, Agent, or Firm*—Foley & Lardner

[57] ABSTRACT

In a metal alloy formed by first and second metal members for a semiconductor device, the first metal member is composed of approximately 0.1 to 10 wt. percent Cu with the residual amount being substantially composed of Al, and the second metal member is composed of approximately 0.5 to 5 wt. percent with the residual amount being substantially composed of Au.

34 Claims, 8 Drawing Sheets

| SAMPLE | Tg (°C) | WIRE | ELECTRODE | 10ppm LIFE TIME (Hr) AT 150°C | 10ppm LIFE TIME (Hr) AT 125°C | ACTIVATION ENERGY $\Delta E_a$ |
|---|---|---|---|---|---|---|
| X1 | 149 | Au | Al·Si | 555 | 2310 | 0.84 |
| X2 | 160 | Au | Al·Si | 926 | 3890 | 0.84 |
| X3 | 195 | Au | Al·Si | 1350 | 5770 | 0.84 |
| X4 | 149 | Au·Cu | Au·Si | 1220 | 5160 | 0.84 |

| SAMPLE | Tg (°C) | WIRE | ELECTRODE | 10ppm LIFE TIME (Hr) AT 150°C | 10ppm LIFE TIME (Hr) AT 125°C | ACTIVATION ENERGY ΔE$_a$ |
|---|---|---|---|---|---|---|
| Y1 | 149 | Au | Al·Si·Cu | 1130 | 4710 | 0.80 |
| Y2 | 149 | Au·Pd | Al·Si·Cu | 14200 | 59800 | 0.80 |

| SAMPLE | Tg (°C) | WIRE | ELECTRODE | 10ppm LIFE TIME (Hr) AT 150°C | 10ppm LIFE TIME (Hr) AT 125°C | ACTIVATION ENERGY $\Delta E_a$ |
|---|---|---|---|---|---|---|
| Z1 | 149 | Au | Al·Si·Cu | 519 | 5280 | 1.2 |
| Z2 | 149 | Au·Pd | Al·Si·Cu | >5370 | >51930 | 1.2 |

SEMICONDUCTOR DEVICE HAVING METAL ALLOY FOR ELECTRODES

BACKGROUND OF THE INVENTION

1. Field of the Invention

The present invention relates to a semiconductor device, and more particularly, to a metal alloy for pads (electrodes) and wires (or bumps) of the semiconductor device.

2. Description of the Related Art

Generally, a semiconductor device is constructed by a lead frame, a semiconductor chip mounted on an island of the lead frame, and wires connected between electrodes of the semiconductor chip and leads of the lead frame. The semiconductor device is sealed by a resin molded package.

In a prior art semiconductor device, the electrodes are made of aluminum (Al) or aluminum silicon (AlSi), and the wires are made of gold (Au). Since Au has a large malleability and ductility, the Au wires are hardly broken by the stress of resin while injecting and cooling (or hardening) it. Also, since Au is most inert among metals, the Au wires are hardly eroded by impurities and water included in the resin, and also, the Au wires are hardly oxidized by the atmospheric air.

On the other hand, in a multi-media field or the like, since semiconductor devices have been highly-integrated and operate at a high speed, the heat dissipation per semiconductor chip has been remarkably increased. As a result, the junction temperature $T_j$ of such semiconductor devices needs to be higher than 125° C. Note that the junction temperature of conventional semiconductor devices is lower than 100° C., and even the junction temperature of semiconductor devices specially for automobiles is lower than 125° C. In addition, in order to reduce the junction temperature, the semiconductor devices may be sealed in a ceramic package or a metal package which has a good heat dissipating effect, or may be sealed in a resin molded package associated with a heat sink. Note that any of the ceramic package, the metal package and the resin molded package associated with a built-in heat sink surely increase the manufacturing cost.

Therefore, even in a multi-media field or the like requiring a large power dissipation per semiconductor chip, a resin molded package without such a built-in heat sink is indispensible, in view of the manufacturing cost. In this case, it is required to guarantee a junction temperature of higher than 125° C.

In the above-described prior art resin molded semiconductor device without a heat sink, however, in order to guarantee a junction temperature higher than 125° C., when an acceleration reliability test as a high temperature storage test is applied to the semiconductor device at a temperature higher than 150° C., such as 175 to 200° C., compound layers called "purple plague" or the like may grow between the electrodes (Al or AlSi) and the wires (Au), which deteriorates the combining (bonding) strength therebetween. At worst, Kirkendall voids may be created between the electrodes and the wires, so that the wires are disconnected from the electrodes. This will be explained later in detail.

In addition, the failure rate of resin molded semiconductor devices due to the deterioration of the combining (bonding) strength between the electrodes and the wires is dependent upon the glass transition temperature $T_g$ of resin. That is, the higher the glass transition temperature $T_g$ of resin, the lower the failure rate of semiconductor devices. This will also be explained later in detail.

Note that JP-A-2-119148 discloses that a wire is composed of 1 to 5 wt. percent copper (Cu) with the residual amount being substantially composed of Au. Also, JP-A-4-229631 discloses that a wire is composed of 5 to 30 wt. percent Cu with the residual amount being substantially composed of Au. Further, JP-A-56-49535 discloses that a wire is composed of 1 to 40 wt. percent palladium (Pd) with the residual amount is substantially composed of Au. Thus, the combining (bonding) strength between the electrodes and the wires is improved. According to any of JP-A-2-119148, JP-A-4-229631 and JP-A-56-49535, however, the improvement of the combining (bonding) strength between the electrodes and the wires is insufficient, and no consideration is given to the effect of compound of Cu and Pd.

SUMMARY OF THE INVENTION

It is an object of the present invention to further improve the high temperature reliability of the combining (bonding) strength between electrodes and wires of a semiconductor device (chip).

Another object is to provide a semiconductor device having an improved bump.

A still other object is to provide a novel metal alloy used in a semiconductor device.

According to the present invention, in a metal alloy formed by first and second metal members for a semiconductor device, the first metal member is composed of approximately 0.1 to 10 wt. percent Cu with the residual amount being substantially composed of Al, and the second metal member is composed of approximately 0.5 to 5 wt. percent Pd with the residual amount being substantially composed of Au.

Also, in a metal alloy for a semiconductor device, it is composed of approximately 0.1 to 10 wt. percent Cu and approximately 0.5 to 5 wt. percent Pd with the residual amount being substantially composed of Al.

Further, in a metal alloy formed by first and second metal members for a semiconductor device, the first metal member is composed of approximately 0.1 to 10 wt. percent Cu with the residual amount being substantially composed of Al, the second metal member is composed of substantially pure Pd. Also, a third metal member substantially composed of Au can be provided on the second metal member.

Moreover, in a semiconductor device including a semiconductor chip, electrodes formed on the semiconductor chip, and wires (or bumps) each contacted to one of the electrodes, each of the electrodes includes a first metal member composed of approximately 0.1 to 10 wt. percent Cu with the residual amount being substantially composed of Al, and each of the wires (or bumps) includes a second metal member composed of approximately 0.5 to 5 wt. percent Pd with the residual amount being substantially composed of Au.

Furthermore, in a semiconductor device including a semiconductor chip, electrodes formed on the semiconductor chip, and wires (or bumps) each contacted to one of the electrodes, each of the electrodes includes a first metal member composed of approximately 0.1 to 10 wt. percent Cu with the residual amount being substantially composed of Al and a second metal member which is formed on the first metal member and is substantially composed of Pd. Also, the wires (or bumps) are substantially composed of Au.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art semiconductor device will be explained with reference to FIGS. 1, 2, 3, 4A, 4B, 5A and 5B.

Figure 1:
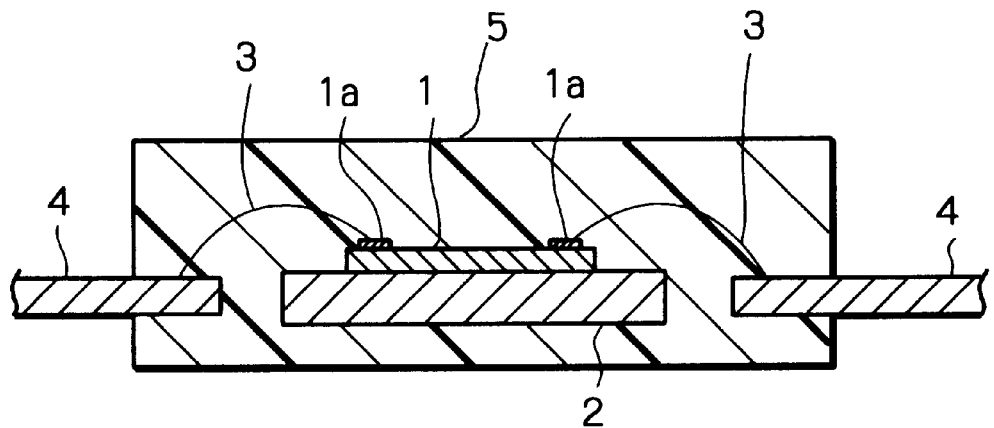
FIG. 1 is a cross-sectional view illustrating a prior art resin molded semiconductor device.

In FIG. 1, which illustrates a prior art resin molded semiconductor device, a semiconductor chip 1 is mounted by an adhesive layer (not shown) on an island 2 of a lead frame. Also, the semiconductor chip 1 has electrodes $1a$ thereon which are bonded by bonding wires 3 to leads 4 of the lead frame. The semiconductor chip 1 associated with the electrodes $1a$, the island 2, the wires 3 and the leads 4 are sealed by a molding resin envelope 5.

Figure 2:
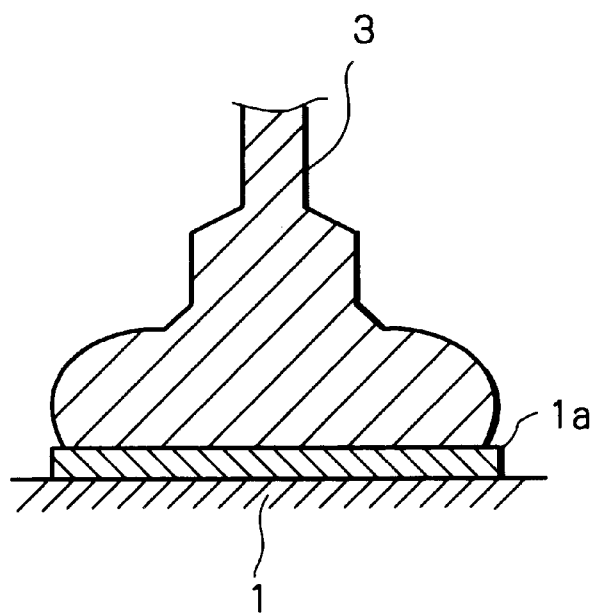
FIG. 2 is a cross-sectional view of a partial enlargement of the metal junction structure of FIG. 1.

In FIG. 2, which is an enlargement of the metal junction structure between one of the electrodes $1a$ and one of the wires 3, the electrodes $1a$ are made of Al or AlSi, and the wires 3 are made of Au.

The semiconductor device of FIGS. 1 and 2 are mounted by reflowing solder on a printed board.

It is required to guarantee the semiconductor device of FIG. 1, particularly, the metal junction structure of FIG. 2 operated at a high temperature. A method for guaranteeing the metal junction structure is realized by the inventors. That is, a temperature $T_j$ of the metal junction structure is represented by $$T_j = T_a + R_{th} \cdot PW$$

where $T_a$ is an ambient temperature (°C.), $R_{th}$ is a heat resistance of the entire semiconductor device (deg/W), and PW is a power (W) supplied to the semiconductor device.

Also, the heat resistance $R_{th}$ is represented by $$R_{th} = R_{th}(j-c) + R_{th}(c-a)$$

where $R_{th}(j-c)$ is a heat resistance between the semiconductor chip 1 and the molding resin envelope 5; and $R_{th}(c-a)$ is a heat resistance between the molding resin envelope 5 and the ambient atmosphere.

In order to obtain a high reliability at a metal junction temperature $T_j$ of 125 to 150° C., if $T_a$ is 100° C. and PW is 1W, then $$R_{th} = (T_j - T_a)/PW$$
$$= 25 \sim 50 \ (\text{deg}/W)$$
$$> 20 \ (\text{deg}/W)$$

Figure 3:
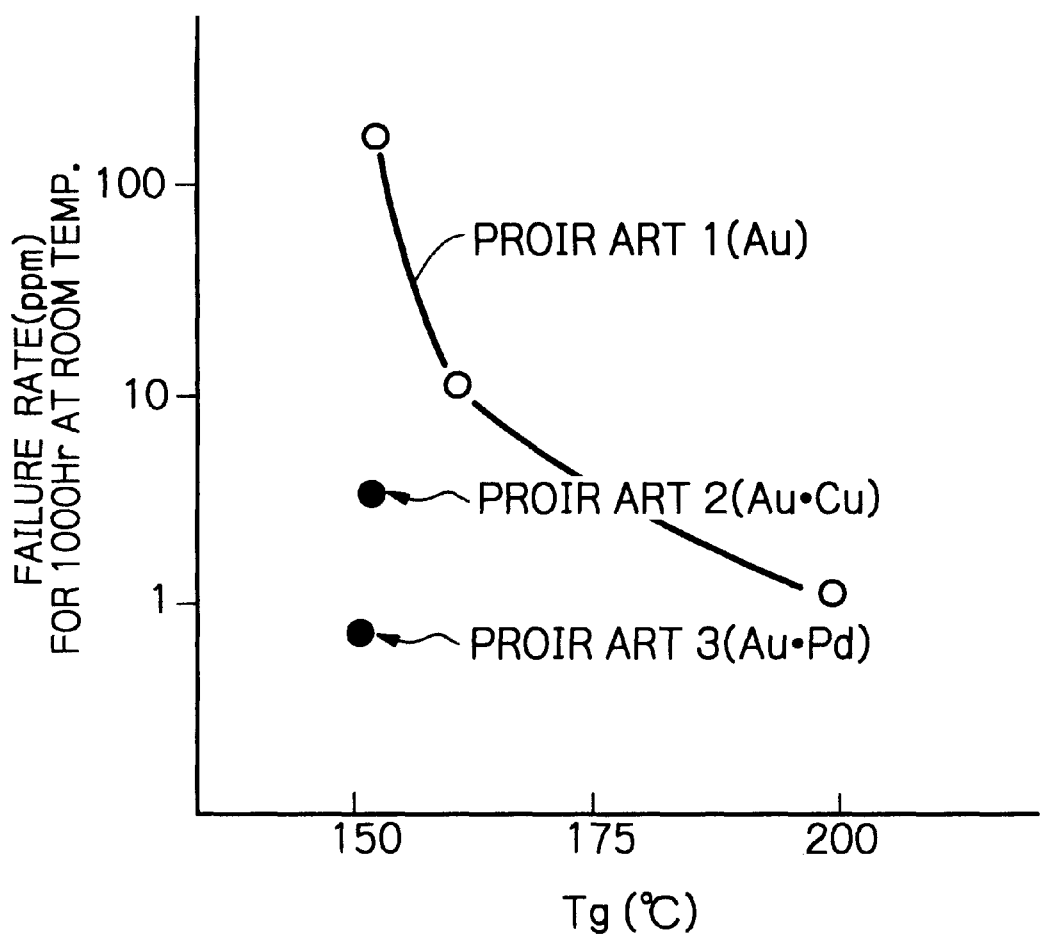
FIG. 3 is a graph showing the failure rate of the device of FIG. 1.

Also, under the condition that $R_{th} > 20$ (deg/W), a 10 parts per million (ppm) life time is required to be larger than 1000 hours. In this case, the inventors found that the life time is dependent upon the glass transition temperature $T_g$ of the resin molding envelope 5 as shown in FIG. 3. That is, as indicated by PRIOR ART 1 in FIG. 3 where the wires 3 are made of pure Au, when the composition of silica of the resin molding envelope 5 is changed, so that the glass transition temperature $T_g$ of the resin molding envelope 5 is 150° C., 160° C. and 200° C., the lower the failure rate, the higher the glass transition temperature $T_g$. However, note that, when the glass transition temperature $T_g$ is too high, although the modulus of direct elasticity of the resin molding envelope 5 is small so that the resin molding envelope 5 is rigid, the flexibility of the resin molding envelope 5 is low, which creates a problem in mounting the semiconductor device. That is, when a heating operation for soldering is performed upon the semiconductor device, water within the resin molding envelope 5 may rapidly evaporate to create cracks therein. On the other hand, as indicated by PRIOR ART 2 in FIG. 3 where the wires 3 are made of Au+1 wt. percent Cu corresponding to JP-A-2-119148, even when the resin molding envelope 5 has a glass transition temperature of about 140° C. to 160° C., the failure rate can be reduced. In addition, as indicated by PRIOR ART 3 in FIG. 3 where the wires 3 are made of Au+1 wt. percent Pd corresponding to JP-A-56-49535, even when the resin molding envelope 5 has a glass transition temperature of about 140° C. to 160° C., the failure rate can also be reduced. Note that the failure rate in PRIOR ART 2 and PRIOR ART 3 is not sufficiently low.

Figures 4A, 4B:
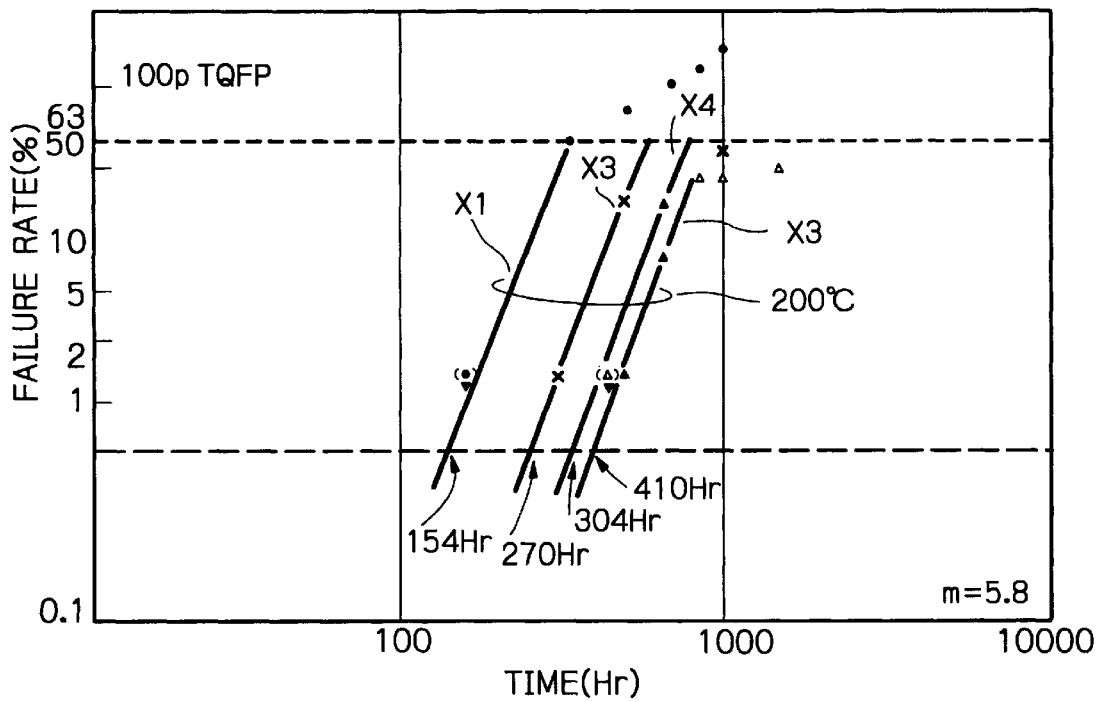
FIG. 4A is a table showing the life time of the device of FIG. 1.
FIG. 4B is a graph showing the failure rate of the device of FIG. 1.

The life time and failure rate of the prior art semiconductor device where the electrodes $1a$ are made of Al.Si and the wires 3 are made of Au or Au.Cu are shown in FIGS. 4A and 4B where samples are constructed by 100-pin thin quad flat packages (TQFP). In FIG. 4A, an activation energy $\Delta E_a$ is defined by an Arrhenius equation:

$$\ln L = A + \Delta E_a/kT$$

where

L is a life time, k is a Boltzman constant,

T is an absolute temperature, and

A is a constant.

Figure 5A:
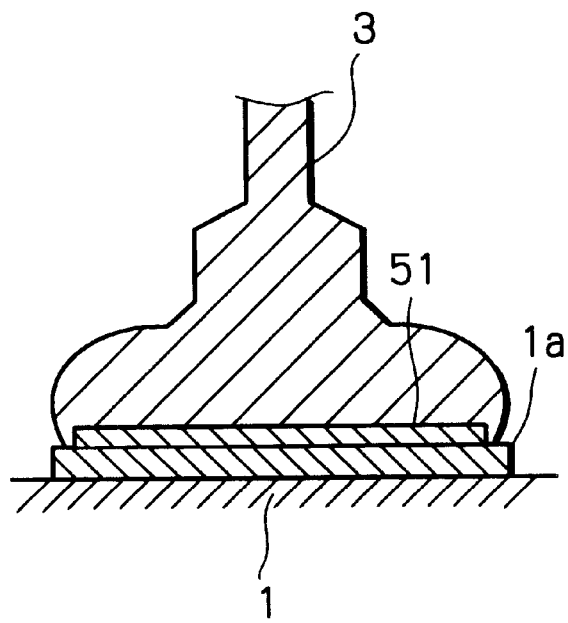
FIGS. 5A and 5B are cross-sectional views for explaining a compound and Kirkendall voids in the metal junction structure of FIG. 2.
Figure 5B:
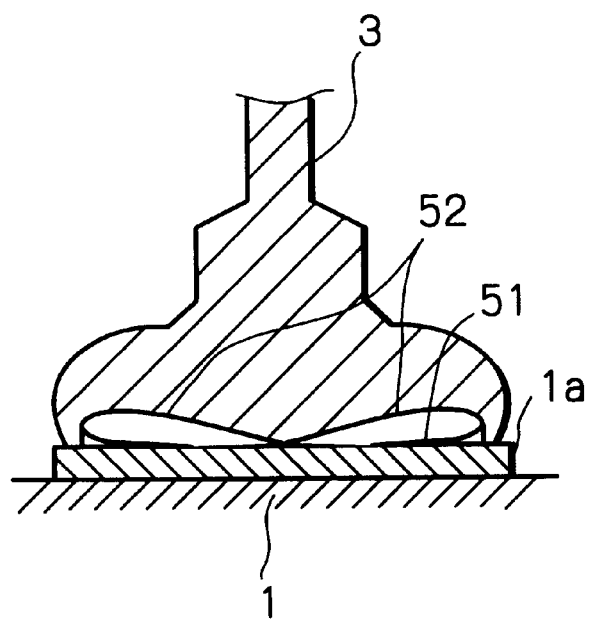

The above-described failure rate in the prior art semiconductor device is worsened due to the generation of a compound 51 and Kirkendall voids 52 as shown in FIGS. 5A and 5B. That is, at a high temperature, the Al component of the electrodes 1a reacts with the Au component of the wires 3 to grow the compound 51 called purple plague or the like therebetween, which deteriorates the combining (bonding) strength therebetween. At worst, the Kirkendall voids 52 are created, so that the wires 3 are disconnected from the electrodes 1a.

Figure 6A:
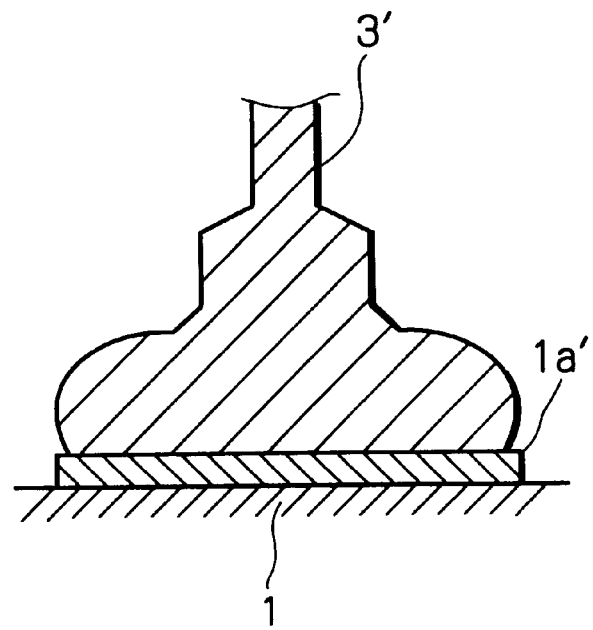
FIGS. 6A is a cross-sectional view illustrating a first embodiment of the semiconductor device according to the present invention.

In FIG. 6A, which is a cross-sectional view illustrating a first embodiment of the present invention, an electrode 1a' is composed of approximately 0.1 to 10 wt. percent Cu with the residual amount being substantially composed of Al, and a wire 3' is composed of approximately 0.5 to 5 wt. percent Pd with the residual amount being substantially composed of Au. That is, the Cu component of the wire 3' suppresses the growth of compound between the electrode 1a' and the wire 3'. Note that, if the Cu component of the wire 3' is larger than 10 wt. percent, the Cu component of the tip portion of the wire 3' is easily oxidized which makes it difficult to carry out a bonding operation.

In FIG. 6A, note that the electrode 1a' can further include a small amount of Si, and the wire 3' can further include a small amount of at least one of lanthanum (La), cerium (Ce), calcium (Ca) and bismuth (Bi), which does not affect the property of the metal alloy.

Figure 6B:
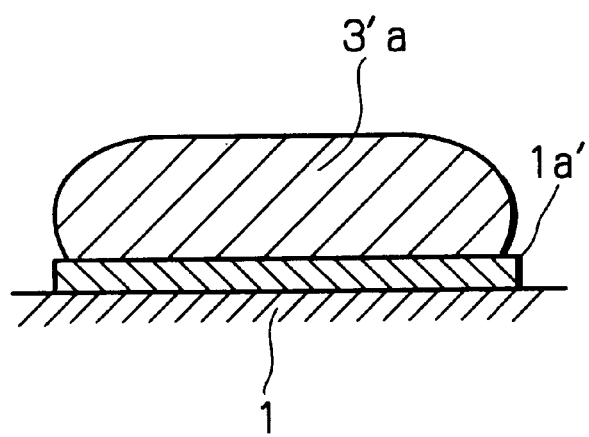
FIG. 6B is a cross-sectional view illustrating a modification of FIG. 6A.

In FIG. 6B, which is a modification of FIG. 6A, a bump 3'a is provided instead of the wire 3' of FIG. 6A. In this case, when the electrode 1a' is made of approximately 0.1 to 10 wt. percent Cu with a residual amount being substantially composed of Al, the bump 3'a is made of approximately 0.5 to 5 wt. percent Pd with a residual amount being substantially composed of Au. Also, when the electrode 1a' is made of approximately 0.1 to 10 wt. percent Cu and approximately 0.5 to 5 wt. percent Pd with the residual amount being substantially composed of Al, the bump 3'a is substantially composed of Au.

In FIG. 6B, note that the electrode 1a' can further include a small amount of Si, and the bump 3'a can further include a small amount of at least one of La, Ce, Ca and Bi, which does not affect the property of the metal junction structure.

Figures 7A, 7B:
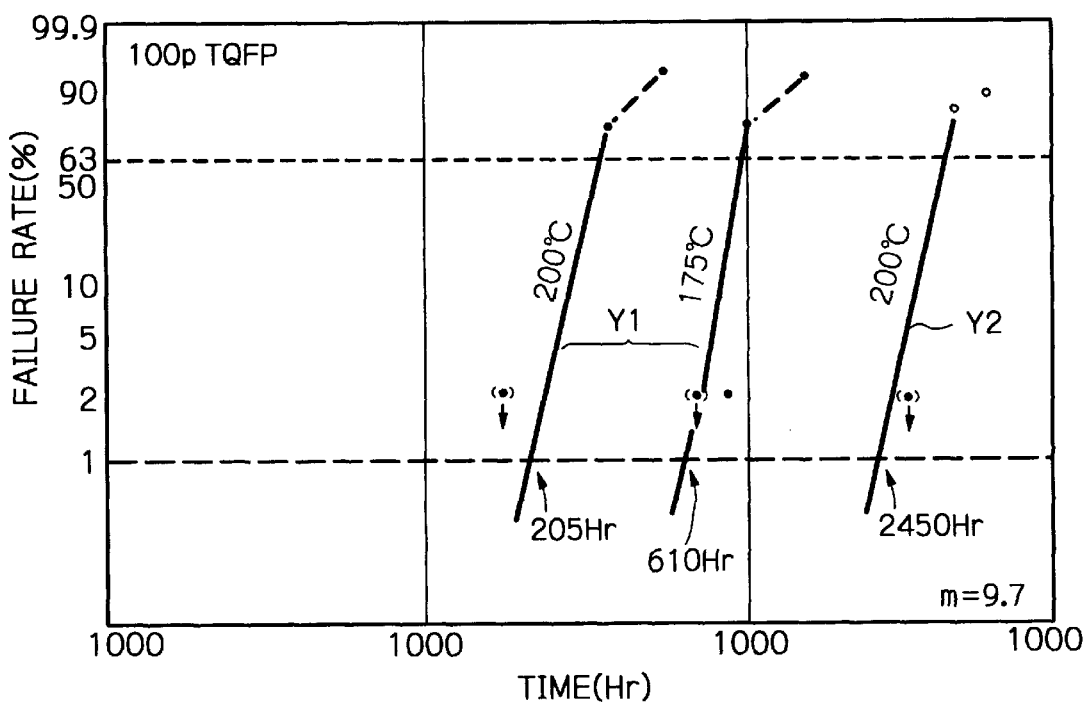
FIG. 7A is a table showing the life time of the device of FIG. 6.
FIG. 7B is a graph showing the failure rate of the device of FIG. 6.

An example of the life time and failure rate of the semiconductor device according to the present invention is shown in FIGS. 7A and 7B where samples are constructed by 100-pin TQFP. That is, the 10 ppm life time of sample Y1 at 150° C. where the electrode is made of Al.Si.Cu and the wire is made of Au is about 2 times that of sample X1 as shown in FIG. 4A. On the other hand, the 10 ppm life time of sample Y2 at 150° C. where the electrode 1a' is made of Al.Si.Cu and the wire 3' is made of Au.Pd is about 26 times that of sample X1 as shown in FIG. 4A. Thus, the combination of Cu and Pd in the metal junction structure remarkably increases the life time.

Figures 8A, 8B:
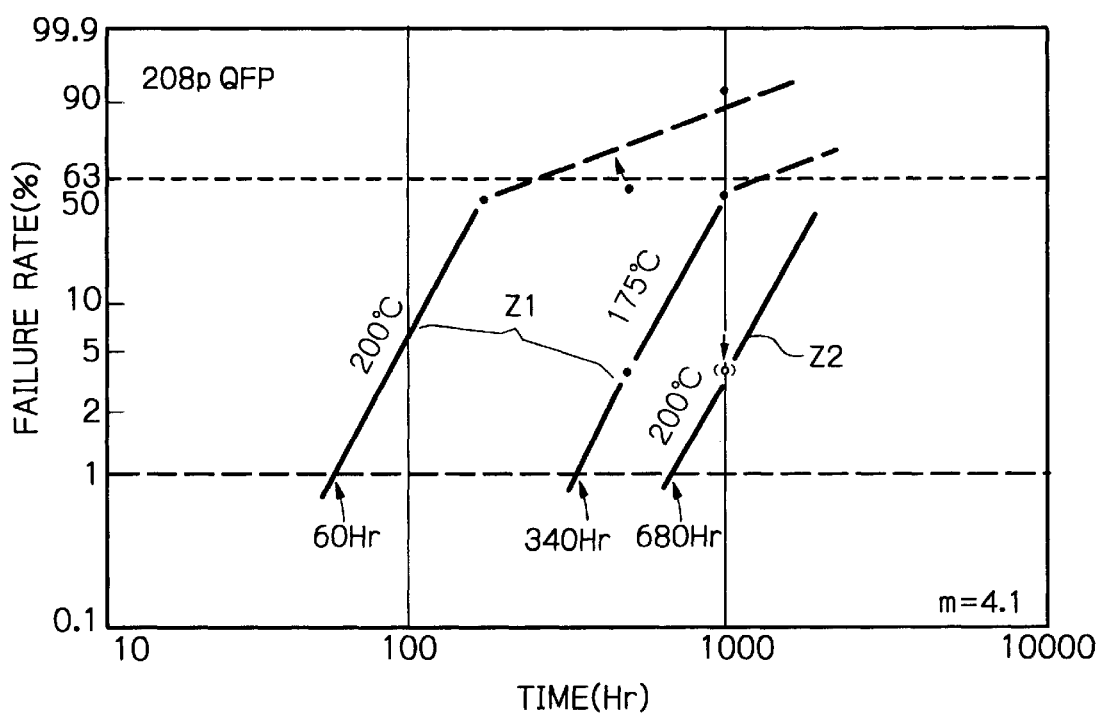
FIG. 8A is another table showing the life time of the device of FIG. 6.
FIG. 8B is another graph showing the failure rate of the device of FIG. 6.

Another example of the life time and failure rate of the semiconductor device according to the present invention is shown in FIGS. 8A and 8B where samples are constructed by a 208-pin QFP. That is, the 10 ppm life time of sample Z1 at 150° C. where the electrode is made of Al.Si.Cu and the wire is made of Au is about the same as that of sample X1 as shown in FIG. 4A. On the other hand, the 10 ppm life time of sample Y2 at 150° C. where the electrode 1a' is made of Al.Si.Cu and the wire 3' is made of Au.Pd is about 10 times that of sample X1 as shown in FIG. 4A. Thus, the combination of Cu and Pd in the metal junction structure also remarkably increases the life time.

Figure 9A:
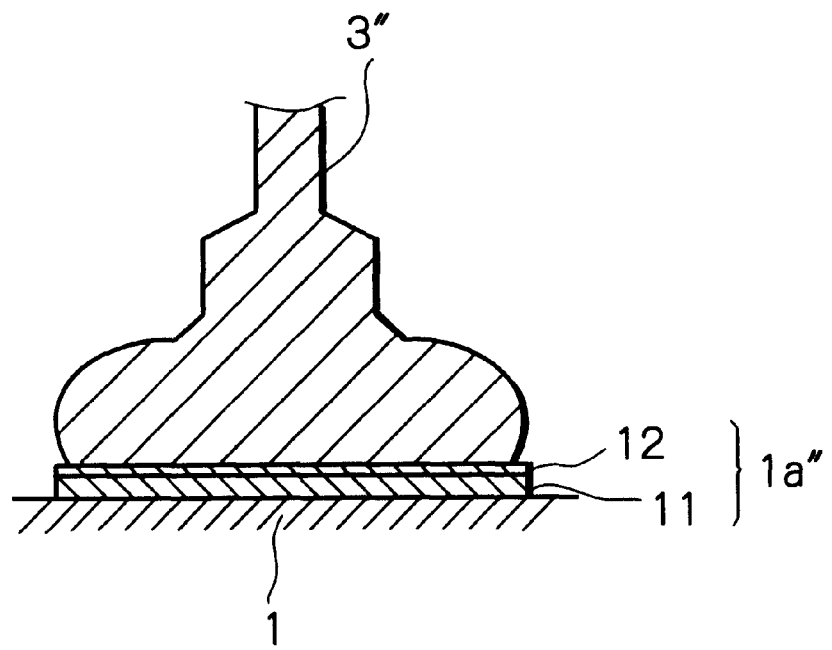
FIG. 9A is a cross-sectional view illustrating a second embodiment of the semiconductor device according to the present invention.

In FIG. 9A, which illustrates a second embodiment of the present invention, an electrode 1a" is formed by two metal members 11 and 12. The metal member 11 corresponds to the electrode 1a', i.e., composed of approximately 0.1 to 10 wt. percent Cu with the residual amount being substantially composed of Al. The metal member 12 is made of pure Pd which is formed by using a sputtering method. On the other hand, a wire 3" is substantially composed of Au. Even in the second embodiment, the combination of Cu and Pd in the metal junction structure suppresses the growth of a compound or Kirkendall voids therein, thus increasing the life time.

Figure 9B:
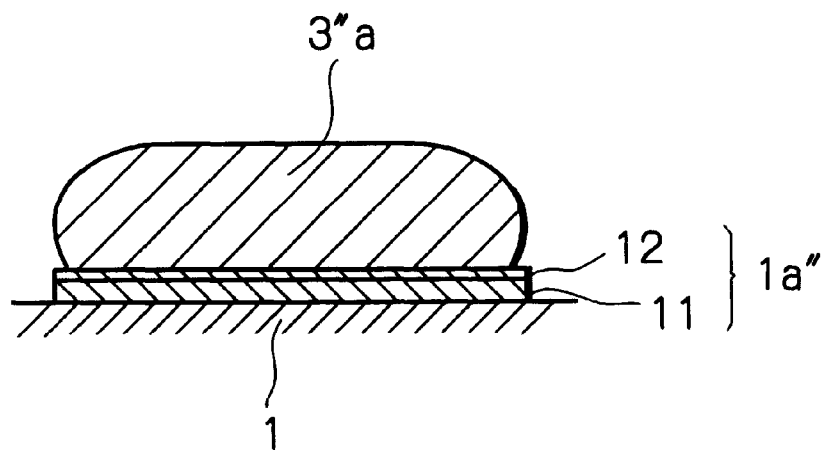
FIG. 9B is a cross-sectional view illustrating a modification of FIG. 9A.

In FIG. 9B, which is a modification of FIG. 9A, a bump 3"a is provided instead of the wire 3" of FIG. 9A. In this case, the bump 3"a is made of Au.

When other accelerated physical environmental reliability tests, other than the life time test, such as a temperature cycle test and a pressure cooker test (PCT) are performed upon the semiconductor device of the prior art and according to the present invention, the inventors have confirmed that there is no substantial difference therebetween.

In the above-mentioned embodiments, the resin molding envelope 5 can be made of phenolic novolac epoxy resin, biphenyl epoxy resin or the like. Further, the present invention can be applied to a ceramic package type semiconductor device or a metal package type semiconductor device.

As explained hereinabove, according to the present invention, since Cu and Pd are both introduced into a metal alloy between an electrode and a wire (or bump), the growth of a compound or Kirkendall voids therein can be suppressed, thus remarkably increasing the life time of a semiconductor device.

We claim:

1. A metal alloy formed by first and second metal members for a semiconductor device, wherein said first metal member is composed of approximately 0.1 to 10 wt. percent Cu with a residual amount being substantially composed of Al, said second metal member being composed of approximately 0.5 to 5 wt. percent Pd with a residual amount being substantially composed of Au.

2. The metal alloy as set forth in claim 1, wherein said first metal member is further composed of Si.

3. The metal alloy as set forth in claim 1, wherein said second metal member is further composed of at least one of La, Ce, Ca and Bi.

4. The metal alloy as set forth in claim 1, wherein each electrode of said semiconductor device includes said first metal member, and each wire of said semiconductor device includes said second metal member.

5. A metal alloy for a semiconductor device, including approximately 0.1 to 10 wt. percent Cu and approximately 0.5 to 5 wt. percent Pd with a residual amount being substantially composed of Al.

6. The metal alloy as set forth in claim 5, further including Si.

7. The metal alloy as set forth in claim 5, further including at least one of La, Ce, Ca and Bi.

8. The metal alloy as set forth in claim 5, being used as each electrode of said semiconductor device.

9. A metal alloy formed by first, second and third metal members for a semiconductor device, wherein said first metal member is composed of approximately 0.1 to 10 wt. percent Cu and with a residual amount being substantially composed of Al, said second metal member being substantially composed of pure Pd and at least one of La, Ce, Ca and Bi, said third metal member being substantially composed of Au.

10. The metal alloy as set forth in claim 9, wherein said first metal member is further composed of Si.

11. The metal alloy as set forth in claim 9, wherein each electrode of said semiconductor device includes said first and second metal members, and each wire of said semiconductor device includes said third metal member.

12. A metal alloy formed by first, second and third metal members for a semiconductor device, wherein said first metal member is composed of approximately 0.1 to 10 wt. percent Cu and with a residual amount being substantially composed of Al, said second metal member being substantially composed of pure Pd, said third metal member being substantially composed of Au, wherein said third metal member is further composed of at least one of La, Ce, Ca and Bi.

13. A metal alloy formed by first and second metal members for a semiconductor device, wherein said first metal member is composed of approximately 0.1 to 10 wt. percent Cu and with a residual amount being substantially composed of Al, said second metal member being substantially composed of pure Pd and at least one of La, Ce, Ca and Bi.

14. The metal alloy as set forth in claim 13, wherein said first metal member is further composed of Si.

15. The metal alloy as set forth in claim 13, said metal alloy being used as each electrode of said semiconductor device.

16. A semiconductor device comprising:

a semiconductor chip;

electrodes formed on said semiconductor chip, each of said electrodes including a first metal member composed of approximately 0.1 to 10 wt. percent Cu with a residual amount being substantially composed of Al; and wires each being contacted to one of said electrodes and including a second metal member composed of approximately 0.5 to 5 wt. percent Pd with a residual amount being substantially composed of Au.

17. The device as set forth in claim 16, wherein said first metal member is further composed of Si.

18. The device as set forth in claim 16, wherein said second metal member is further composed of at least one of La, Ce, Ca and Bi.

19. A semiconductor device comprising:

a semiconductor chip;

electrodes formed on said semiconductor chip, each of said electrodes including a first metal member composed of approximately 0.1 to 10 wt. percent Cu with a residual amount being substantially composed of Al; and bumps each being contacted to one of said electrodes and including a second metal member composed of approximately 0.5 to 5 wt. percent Pd with a residual amount being substantially composed of Au.

20. The device as set forth in claim 19, wherein said first metal member is further composed of Si.

21. The device as set forth in claim 19, wherein said second metal member is further composed of at least one of La, Ce, Ca and Bi.

22. A semiconductor device comprising:

a semiconductor chip;

electrodes formed on said semiconductor chip, each of said electrodes including a first metal member composed of approximately 0.1 to 10 wt. percent Cu and approximately 0.5 to 5 wt. percent Pd with a residual amount being substantially composed of Al; and bumps each being contacted to one of said electrodes and including a second metal member substantially composed of Au.

23. The device as set forth in claim 22, wherein said first metal member is further composed of Si.

24. The device as set forth in claim 22, wherein said second metal member is further composed of at least one of La, Ce, Ca and Bi.

25. A semiconductor device comprising:

a semiconductor chip;

electrodes formed on said semiconductor chip, each of said electrodes including a first metal member composed of approximately 0.1 to 10 wt. percent Cu with a residual amount being substantially composed of Al and a second metal member being formed on said first metal member and being substantially composed of Pd and at least one of La, Ce, Ca and Bi; and wires, each being contacted to one of said electrodes and being substantially composed of Au.

26. The device as set forth in claim 25, wherein said wires are further composed of at least one of La, Ce, Ca and Bi.

27. A semiconductor device comprising:

a semiconductor chip;

electrodes formed on said semiconductor chip, each of said electrodes including a first metal member composed of approximately 0.1 to 10 wt. percent Cu with a residual amount being substantially composed of Al and a second metal member being formed on said first metal member and being substantially composed of Pd and at least one of La, Ce, Ca and Bi; and bumps, each being contacted to one of said electrodes and being substantially composed of Au.

28. The device as set forth in claim 27, wherein said bumps are further composed of at least one of La, Ce, Ca and Bi.

29. A semiconductor device comprising:

a semiconductor chip;

electrodes formed on said semiconductor chip, each of said electrodes including a first metal member composed of approximately 0.1 to 10 wt. percent Cu and approximately 0.5 to 5 wt. percent Pd with a residual amount being substantially composed of Al; and wires each being contacted to one of said electrodes and including a second metal member substantially composed of Au.

30. The device as set forth in claim 29, wherein said first metal member is further composed of Si.

31. The device as set forth in claim 29, wherein said second metal member is further composed of at least one of La, Ce, Ca and Bi.

32. The device as set forth in claim 29, further comprising a resin mold layer for encapsulating said semiconductor chip, said electrodes and said wires, said resin mold layer having a glass transition temperature of lower than approximately 160° C.

33. The device as set forth in claim 29, further comprising a ceramic package for sealing said semiconductor chip, said electrodes and said wires.

34. The device as set forth in claim 29, further comprising a metal package for sealing said semiconductor chip, said electrodes and said wires.

* * * * *